United States Patent

Goel et al.

[11] Patent Number: 5,795,648
[45] Date of Patent: Aug. 18, 1998

[54] METHOD FOR PRESERVING PRECISION EDGES USING DIAMOND-LIKE NANOCOMPOSITE FILM COATINGS

[75] Inventors: Arvind Goel, Buffalo; Donald J. Bray, East Amherst, both of N.Y.

[73] Assignee: Advanced Refractory Technologies, Inc., Buffalo, N.Y.

[21] Appl. No.: 538,731

[22] Filed: Oct. 3, 1995

[51] Int. Cl.$^6$ .............................. B05D 3/06; B26B 21/00
[52] U.S. Cl. .................... 428/336; 428/408; 428/446; 428/697; 428/457; 427/249; 427/255.2; 427/255.3; 427/574; 427/578; 30/346.53; 30/346.54; 30/346.55
[58] Field of Search ........................... 428/408, 446, 428/336, 457, 697; 30/346.53, 346.54, 346.55; 427/249, 255.3, 574, 578

[56] References Cited

U.S. PATENT DOCUMENTS

| | | |
|---|---|---|
| 4,191,735 | 3/1980 | Nelson et al. . |
| 4,783,368 | 11/1988 | Yamamoto et al. . |
| 4,816,291 | 3/1989 | Desphandey et al. . |
| 4,822,466 | 4/1989 | Rabalais et al. . |
| 4,842,937 | 6/1989 | Meyer et al. . |
| 4,877,677 | 10/1989 | Hirochi et al. . |
| 4,897,829 | 1/1990 | Ikoma et al. . |
| 4,915,977 | 4/1990 | Okamoto et al. . |
| 4,925,701 | 5/1990 | Jansen et al. ............ 427/38 |
| 4,948,388 | 8/1990 | Ringwood . |
| 4,960,643 | 10/1990 | Lemelson . |
| 4,961,958 | 10/1990 | Desphandey et al. . |
| 4,980,021 | 12/1990 | Kitamura et al. . |
| 4,985,051 | 1/1991 | Ringwood . |
| 4,992,298 | 2/1991 | Deutchman et al. . |
| 5,002,899 | 3/1991 | Geis et al. . |
| 5,040,501 | 8/1991 | Lemelson . |
| 5,055,318 | 10/1991 | Deutchman et al. . |
| 5,064,801 | 11/1991 | Juntgen et al. . |
| 5,068,148 | 11/1991 | Nakahara et al. . |
| 5,077,103 | 12/1991 | Wagner et al. . |
| 5,087,434 | 2/1992 | Frenklach et al. . |
| 5,094,915 | 3/1992 | Subramaniam . |
| 5,100,424 | 3/1992 | Jang et al. . |
| 5,101,288 | 3/1992 | Ohta et al. . |

(List continued on next page.)

FOREIGN PATENT DOCUMENTS 2 158 086   3/1985   United Kingdom .

OTHER PUBLICATIONS

Dorfman, "Diamond–Like Nanomcomposites (DLN)", Thin Solid Films, 267–273:212 (1992).
R. d'Agostino, ed., "Plasma Deposition, Treatment and Etching of Polymers", Academic Press, San Diego, 1990.
Dorfman, V.F., et al., Sov. Phys. Dokl., 28 (1983) 743 (English Abstract).
Dorfman, V., "Synthetics of Solid State Structure", Metallurgia, Moscow (1986).
Dorfman, V., et al. Diamond Films '90, Proc. 1st European Conf. on Diamond and Diamond–Like Carbon Coatings, Crans–Montana (1990).
Weissmantel et al. J. Vac. Sci. Technol. vol. A4, 2892.
Dorfman, et al. J. Tech. Phys. Lett., 14:1033 (1988).
Ageev, "Light Induced Variations of Optical Properties of Diamond–Like Films", Surface and Coating Technologies, 47:269–278 (1991).

*Primary Examiner*—Archene Turner
*Attorney, Agent, or Firm*—Nixon, Hargrave, Devans & Doyle LLP

[57] ABSTRACT

A method for preserving the precision-edges of a precision-edged substrate by applying to a the substrate a corrosion resistant coating comprising a diamond-like solid state material having interpenetrating atomic scale networks comprising a first diamond-like carbon network stabilized by hydrogen, a silicon network stabilized by oxygen, and optionally at least one network made from dopant elements or dopant compounds containing elements from Groups 1–7b and 8 of the periodic table.

28 Claims, 6 Drawing Sheets

U.S. PATENT DOCUMENTS

| | | |
|---|---|---|
| 5,110,577 | 5/1992 | Tamor et al. |
| 5,135,808 | 8/1992 | Kimock et al. |
| 5,137,784 | 8/1992 | Suzuki et al. |
| 5,142,390 | 8/1992 | Ohta et al. |
| 5,169,579 | 12/1992 | Marcus et al. |
| 5,171,732 | 12/1992 | Hed. |
| 5,174,983 | 12/1992 | Snail. |
| 5,177,299 | 1/1993 | Kondo et al. |
| 5,183,602 | 2/1993 | Raj et al. |
| 5,190,807 | 3/1993 | Kimock et al. |
| 5,198,285 | 3/1993 | Arai et al. |
| 5,202,571 | 4/1993 | Hirabayashi et al. |
| 5,206,083 | 4/1993 | Raj et al. |
| 5,210,430 | 5/1993 | Taniguchi et al. |
| 5,219,769 | 6/1993 | Yonehara et al. |
| 5,243,199 | 9/1993 | Shiomi et al. |

METHOD FOR PRESERVING PRECISION EDGES USING DIAMOND-LIKE NANOCOMPOSITE FILM COATINGS

FIELD OF THE INVENTION

The present invention relates to erosion resistant coatings, and especially precision-edge preserving coatings made from diamond-like materials used to keep substrate edges precise and sharp.

BACKGROUND OF THE INVENTION

The preservation of sharp edges is important for many products and industries. Many bladed industrial and medical tools are only useful if they can have sharp edges which can be maintained for reasonably long periods of time. The sharpness which an edge has is the result of the precision of the edge formed by the substrate and any coatings thereon. Razor blades, for example, have an edge formed by producing a radius of curvature at the blade's extreme tip of from about 75 to about 1000 angstroms. For comparison purposes, a human hair has a width of about 100 micrometers. Such delicate precision substrate edges are often coated to preserve the precision of the edge for longer durations by attempting to inhibit the degradation of the edge.

Precision edge degradation can be caused by corrosive and/or erosive forces. Razor blades, for example dull quite easily; to an extent, immediately upon first use. Steel used for razor blades is therefore often coated first with a sputtered metal coating, followed by a coating of polytetrafluoroethylene (PTFE). While the PTFE coating is usually tens to thousands of angstroms thick, it appears to be substantially removed from the blade upon first use. Enough PTFE seems to survive to provide a measure of continued lubrication. However, the PTFE coatings do not appear to prevent the degradation of the precision edge.

Dulling of precision edges may be due to an increase in the radius of curvature at the blade's extreme tip, cracks, chips or breaks at the edge causing a jagged edge, erosion of edge material, or a combination of these factors. For razor blades, the degradation of the precision edge causes increased friction leading to user discomfort. Eventually the blade is replaced, or if a part of a disposable implement, the entire razor is simply discarded. For more expensive cutting implements in industrial or medical fields, etc., the dulling of precision-edged tools results in the need for sharpening or re-edging which takes time, requires the purchase of replacement equipment, and increases costs.

The depositing of harder material coatings has been tried in an attempt to preserve edge integrity. For many applications, the coating should also have excellent thermal stability; i.e. be able to withstand extreme heat, as from use itself (saw blade) or from sterilization procedures (autoclaving surgical tools).

Metal-based coatings such as steel, zinc, aluminum, chromium, nickel, alloys, cadmium, tantalum, palladium, boron, silicon, copper, gallium, rhenium, alloys thereof, etc. have demonstrated precision edge preservation and are used in many industries to provide protective coatings for sharp edges. However, coatings made from these materials are generally suitable only for metallic substrates.

Silicate based coatings are known to be resistant to air, acid, alkali, and gases at elevated temperatures. However, coatings made from silicates are not particularly strong materials and would not provide appropriate protection for precision edges.

2

Certain ceramic materials used as coatings have displayed good corrosion resistance and could conceivably be used as edge preserving coatings. However, ceramics are brittle and subject to thermal shock failure. They are typically and rough and porous and would not provide the desired low friction.

Certain hard diamond-like coatings (DLCs), have been tried. However, a coating must not only be hard, but must have excellent adherence to the substrate being coated. Known DLCs often require an interlayer to adequately adhere them to a substrate. Ordinarily the presence of such an interlayer may not pose a problem. However, to preserve a precision edge, the total thickness of all deposited coatings must not appreciably increase the radius of curvature at the extreme tip of the edge which is very small. Further, the additional process of depositing interlayers between the DLC and the substrate increases the production cost. This can be significant, and even economically unsound for low cost items, such as disposable razors and disposable razor blades.

Therefore, a strong, hard, highly adherent, temperature, pH and chemical insensitive coating that can be applied to both metal and non-metal surfaces to preserve precision edges without applying interlayers, would be highly desirable.

SUMMARY OF THE INVENTION

The present invention is directed to precision edge-preserving, corrosion and erosion resistant coatings made from a class of diamond-like materials, and substrates coated therewith. The diamond-like nanocomposite materials can be "tuned" or predictably and desirably altered by manipulating the chemical composition, to result in the best combination of properties, offering maximum edge preservation protection to the coated substrates.

In one embodiment, the present invention relates to a method for preserving precision edges of a precision-edged substrate, particularly a sharp-edged substrate, by providing a substrate to be coated and applying to the substrate a coating made from a class of diamond-like materials. The coatings are formed from interpenetrating networks comprising a first network of carbon in a diamond-like carbon network stabilized by hydrogen, a silicon network stabilized by oxygen and, optionally, at least one network of dopant elements, or dopant compounds containing elements from Groups 1–7b and 8 of the periodic table.

A still further embodiment of the present invention relates to a precision-edged apparatus comprising a precision-edged substrate coated with a precision edge-preserving coating. The coating applied to the substrate is made from a class of diamond-like material having interpenetrating atomic scale networks of carbon in a diamond-like carbon network stabilized by hydrogen, a glass-like silicon network stabilized by oxygen, and optionally at least one additional network of dopant elements or compounds containing elements selected from the group consisting of elements from Groups 1–7b and 8 of the periodic table.

DETAILED DESCRIPTION OF THE INVENTION

The present invention is directed to precision edge-preserving, corrosion and erosion resistant coatings made from a class of diamond-like materials and substrates coated therewith. The diamond-like materials can be "tuned" or predictably and desirably altered by manipulating the amounts of substituent to result in the best combination of properties to offer maximum edge preservation protection to the precision-edged substrates.

In one embodiment, the present invention relates to a method for preserving precision edges of a substrate, particularly a sharp-edged substrate, by applying to the substrate a coating made from a class of diamond-like materials. The coatings are formed from interpenetrating networks comprising a first network of carbon in a diamond-like carbon network stabilized by hydrogen, a silicon network stabilized by oxygen and, optionally, at least one network of dopant elements, or dopant compounds containing elements from Groups 1–7b and 8 of the periodic table.

For the purposes of this application, a precision edge is understood to be the area of ultimate narrowing of a substrate, resulting in the convergence of two sides of the substrate to achieve a small radius of curvature at a tip. A small radius of curvature is understood to be one of from about 25 angstroms up to several microns. For very sharp blades, the radius of curvature is from about 75 angstroms to about 1000 angstroms. For other less sharp cutting tools, the radius at the tip may be up to hundreds of microns, while still being considered a precision edge.

Corrosion is defined as the electrochemical degradation of metals or alloys due to reaction with their environment, which is accelerated by the presence of acids or bases. In general, the corrodibility of a metal or alloy depends upon its position in the activity series. Corrosion products often take the form of metallic oxides or halides. In addition, corrosion may be considered to be the degradation of non-metal substrates by exposure to natural environmental conditions as well as exposure to organic materials.

In addition to the edge-preserving and corrosion-resistant properties of the coatings of the present invention, the coatings are strong and erosion resistant, such as to chemicals, abrasion, or ablation while also being highly thermally stable. The coatings would therefore be impervious to biological or chemical attack. The resistance of the coatings of the present invention to erosion, reduces the possibility of, for example, physical chipping. This results in the surface of the substrate being less likely to exposure to environmental corrosive forces. The coatings have excellent adherence to various substrates and are resistant to thermal shock at elevated temperatures beyond those known to erode known diamond-like coatings.

Figure 5:
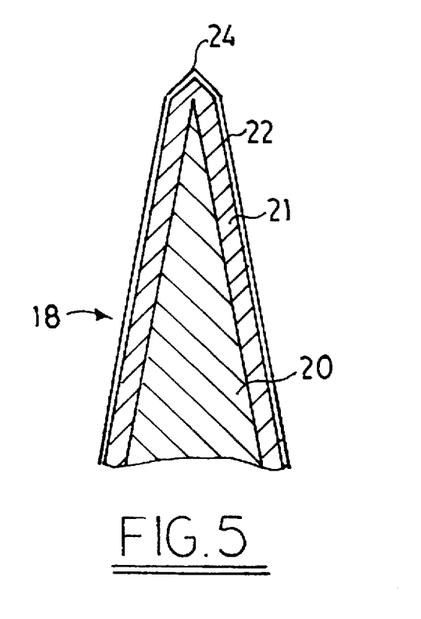
FIG. 5 is an enlarged cross-section view of a razor blade coated with the DLN coating.

In one embodiment, FIG. 5 shows an enlarged cross-sectional view of a razor blade 18 with a precision-edged tip 24 coated with the DLN coating of the present invention. In FIG. 5, a substrate 20 is coated with a layer of DLN 21. A thin coating of polytetrafluoroethylene (PTFE) 22 is shown deposited on the DLN coating 21.

Figure 6:
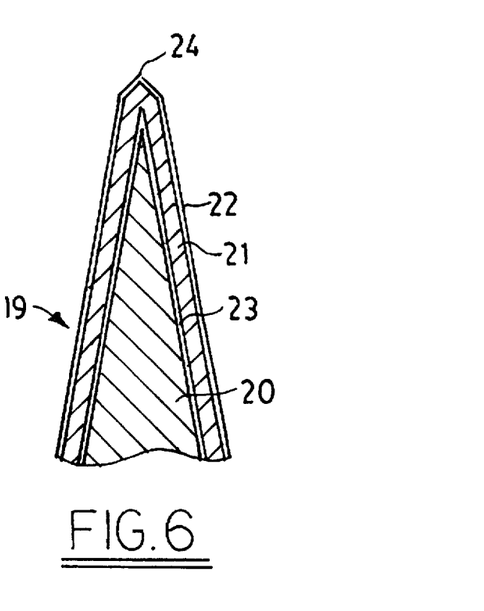
FIG. 6 is an enlarged cross-section view of a razor blade coated with the DLN coating and an interlayer.

FIG. 6 shows a coated blade 19 with a precision-edged tip 24 comprising a substrate 20 that has been coated with an interlayer 23. The interlayer 23 is then coated with the DLN coating 21, which is finally coated with the PTFE coating 22. The interlayer is a thin layer of material selected from silicon, silicon carbide, vanadium, tantalum, niobium, molybdenum and alloys thereof, alone or in combination with one another. The interlayers are deposited to a thickness of from about 50 to about 500 angstroms. The PTFE is deposited to a thickness of from about 10 angstroms to about 1000 angstroms, preferably from about 25 to about 75 angstroms.

Figure 7:
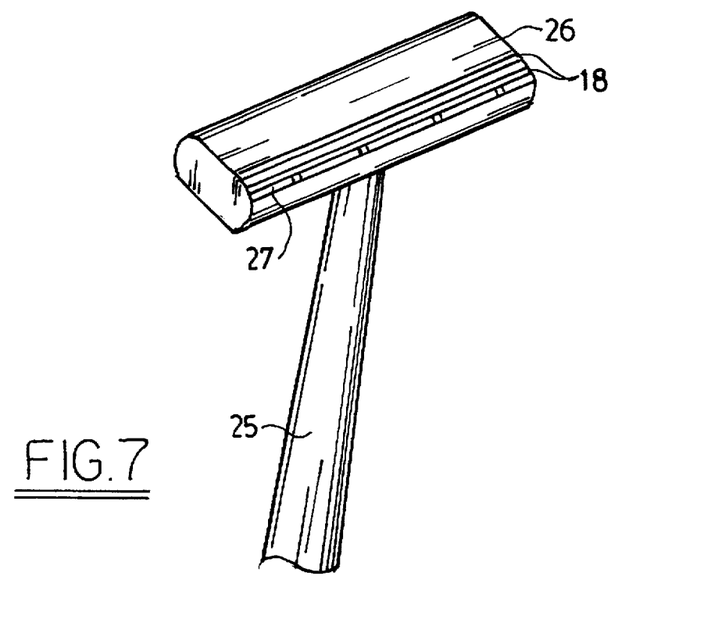
FIG. 7 is perspective view of a razor having DLN-coated razor blades incorporated into the head.

In one embodiment, the blades may be assembled into a razor. FIG. 7 shows the blades 18 of FIG. 5 engaged in the head assembly 26 of a disposable razor 25. An opening 27 in the head allows debris to pass from the shaving plane. It is therefore understood that the DLN coated blades of the present invention may be manufactured as blades, such as replacement double-edged or single-edged blade, or may be incorporated into razor assemblies.

The fundamental structure of the preferred corrosion and erosion resistant atomic scale diamond-like nanocomposites (DLNs) used to coat the selected substrates is comprised of two or more self-stabilized random networks, each stabilized chemically by additional atomic species, while both networks also structurally stabilize each other. An example of a material with such a structure is the diamond-like nanocomposite (DLN) which is the subject of U.S. Pat. No. 5,352,493 and U.S. Ser. No. 08/249,167 filed May 24, 1994.

In the DLN, a random carbon network, mainly in the form of $sp^3$ bonded carbon is chemically stabilized by hydrogen atoms, and a glass-like silicon network is chemically stabilized by oxygen atoms, resulting in a purely amorphous structure. "Amorphous" as used herein refers to a random structure or arrangement of atoms in a solid state that results in no long range regular ordering, and no crystallinity or granularity. The DLN materials have an amorphous structure and do not contain clusters greater than 10 Angstroms. This absence of clusters at the atomic scale is a characteristic of the DLN coatings of the present invention. Clusters can destroy amorphous nature of the structure, and can serve as active centers of degradation. Cluster formation is prevented in the sources, in the primary plasma, in the chamber space, and during film growth.

Figure 1A:
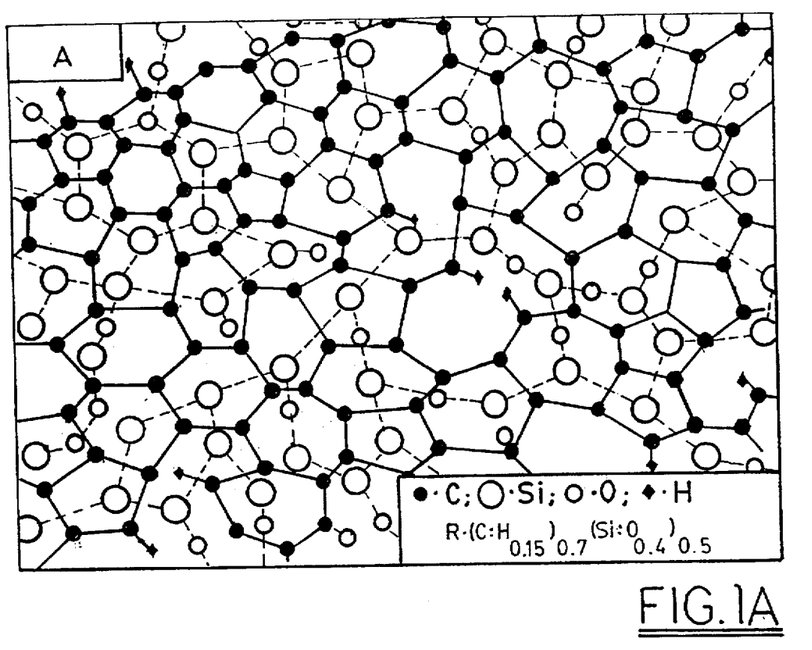
FIG. 1 is a schematic diagram showing the principle microstructure of two-network (A), intermediate (B), and three-network (C) nanocomposites.
Figure 1B:
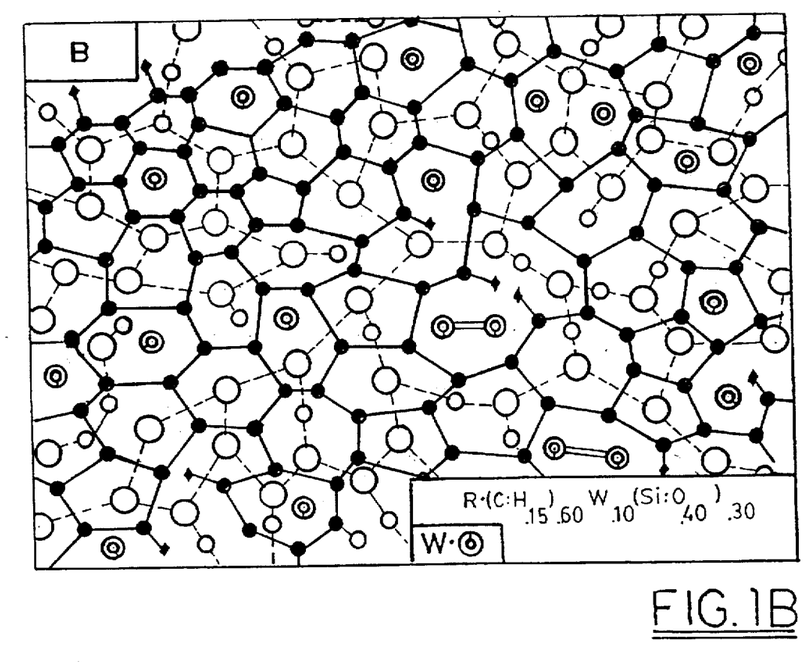
Figure 1C:
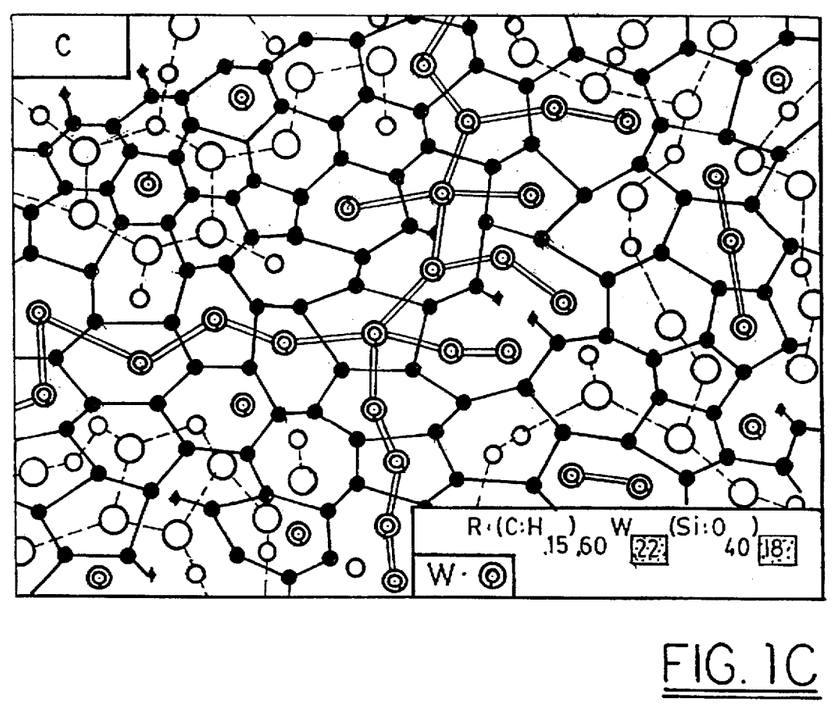

The atomic structure of the class of diamond-like nanocomposite (DLN) materials of the present invention is shown in FIG. 1(A). The materials may have one or more separate disordered networks of dopants, as shown in FIG. 1(B) and 1(C). The dopants may be any one or a combination of the transition metals and non-metals of the Groups 1–7b and 8 of the periodic table, and all three types of networks (C-H; Si-O and the dopant network, Me-Me) bonded to -each other predominantly by weak chemical bonds. The network elements other than the C-H network may be referred to as alloying elements. Further, silicon and oxygen atoms may also be used in the dopant networks with other elements and compounds.

The DLN coatings of the present invention may comprise a two component network: the diamond-like carbon-hydrogen network interpenetrated with the glass-like silicon-oxygen network. A three component network may also be used comprising the Si-O and C-H networks with one or more dopant networks, with the dopants being interspersed with the previously mentioned two interpenetrating networks. In this instance three or more interpenetrating networks will be present in the DLN to form a so-called Me-DLN (metal-diamond-like nanocomposite) network. It is understood that non-metal dopant networks, may be incorporated as the optionally present dopant networks interpenetrating the C-H and Si-O networks.

The three networks (C-H matrix, Si-O matrix and a dopant matrix) are bonded to one another mainly by weak chemical bonds. Carbide formation can be prevented even at metal concentrations as high as 50% (verified using Auger electron spectroscopy, electron spectroscopy for chemical analysis (ESCA), extended x-ray absorption fine structure spectroscopy (EXAFS) and Fourier transform infrared spectroscopy (FTIR)). Again, the properties of these materials can be varied over wide ranges depending on the dopant and the concentration selected, as well as the deposition technique and parameters. As already mentioned, the structure of these composites can be tailored at the molecular level. Therefore, unique electrical, optical, and other desirable solid state properties with desired mechanical strength, hardness and chemical resistance can be imparted on the DLN coatings.

Preferred dopant elements to be used in the Me-DLN network, and which are particularly effective for use as dopants in a corrosion-resistant Me-DLN coating are B, Si, Ge, Te, O, Mo, W, Ta, Nb, Pd, Ir, Pt, V, Fe, Co, Mg, Mn, Ni, Ti, Zr, Cr, Re, Hf, Cu, Al, N, Ag and Au; with W, Cr, Zr, Ti and Hf being preferred. Preferred compounds which may be used as dopants include TiN, BN, AlN, ZrN and CrN; with TiN and ZrN being most preferred.

The carbon content in the diamond-like nanocomposite is greater than about 40 atomic % of the DLN, preferably from about 40 to about 98 atomic %, more preferably from about 50 to about 98 atomic %. Although the DLN may theoretically be prepared without any hydrogen, the hydrogen content is preferably at least about 1 atomic % and up to about 40 atomic % of the carbon concentration. The sum of the silicon, oxygen and dopant elements and dopant containing compounds is greater than about 2 atomic % of the DLN. In one preferred embodiment, the ratio of carbon to silicon atoms is from about 2:1 to about 8:1, hydrogen to carbon atoms is about 0.01:1 to about 0.4:1, silicon to oxygen atoms is about 0.5:1 to about 3:1, and dopant to carbon atoms is about 0:1 to about 1.5:1. Therefore, in the DLN network, for every 1 part carbon, there is from about 0.01 to about 0.4 parts hydrogen, from about 0.125 to about 0.5 parts silicon, and from about 0.0375 to about 1.0 parts oxygen. In such a scheme, if a third dopant network were present, for every 1 part carbon, there would be from about 0.01 to about 1.5 parts dopants depending upon the desired characteristics to be imparted to the Me-DLN network.

The low intrinsic stress found in the DLNs contributes to their corrosion resistance properties. A coating must not only be unreactive to a corrosive agent, but should also act as a barrier layer, preventing contact between the corrosive agent and the protected substrate. DLC films typically possess high intrinsic stresses, and as a result usually suffer from pin holes and overall porosity. Due to the comparatively low stress present in DLN films and coatings, these coatings are pore-free, and therefore resist chemical attack and permeation.

The presence of the glass-like silicon network, stabilized by oxygen, serves to prevent the growth of graphitic carbon at high temperatures, to prevent metal cluster formation in metal-containing three-network nanocomposites, and reduce the internal stress in the nanocomposite structure and thereby enhance the adhesion to substrates. This appears to lead to superior adherence of the DLNs of the present invention to the substrate material.

As already mentioned, to improve adherence of coatings, DLC coatings often require an intermediate layer between the substrate and the DLC coating. Often, if the DLC coatings are too thick, delamination occurs. Surprisingly, with the DLN coatings of the present invention, adherence is so good that an interlayer is usually not required. As a result, the DLN coating may be applied directly to the substrate, and more thickly, without risking delamination from the substrate. The ability to apply a thicker layer of DLN coating results from the low intrinsic stress due to the Si-O network, and is believed to contribute to the superior erosion resistance of the DLN-coated substrates. Of course, interlayers may be used with the DLNs if desired. The tunability of the DLN structure also insures good adherence of the DLN to the interlayer as the DLN may be doped with a dopant to optimize compatibility and adherence to the interlayer as well as to the substrate. Such "tuning" is accomplished by incrementally altering the particular dopant as well as the dopant concentration. The DLNs may also have their properties altered when no dopants are included. In addition to altering chemical composition, changes in properties in the two-network DLN system also can be achieved by altering the deposition conditions in terms of temperature and pressure, etc. The DLNs therefore adhere well to both metal-containing and non-metal containing substrates.

The DLNs of the present invention have temperature stability far exceeding that of traditional diamond-like (DLC) materials. Crystalline diamond is stable to approximately 1100° C., upon which graphitization occurs. Quartz has long term thermal stability to 1470° C., and short term thermal stability up to 1700° C. Traditional, non-alloyed diamond-like (DLC) films are stable only to about 600° C. before graphitization occurs. By contrast, the DLN structures used to provide the corrosion and erosion resistant coatings of the present invention have long term stability to 1250° C. and short term stability to 2000° C. Therefore the thermal stability of the DLNs exceeds that of DLCs while preserving the amorphous, diamond-like state.

Further, in the range of from about 600° C. to about 1000° C., the chemical bonds of the carbon matrix of DLN materials partly change from $sp^3$ to $sp^2$. However, the general structure of the nanocomposite and their "diamond-like" properties are preserved. By contrast, under similar conditions, the usual "diamond-like" carbon (DLC) is graphitized and loses its diamond-like properties. In the range of from 400° C. to 500° C. (preferably 430° C.), a reverse transition is observed, whereby the ratio of $Sp^3$ to $sp^2$ is increased. It is believed that a varying percentage of the carbon in the DLNs is $sp^3$ bonded carbon.

The density of the C-H and Si-O two network DLN varies from about 1.8 to about 2.1 $g/cm^3$. The rest of the space is taken up by a random network of nanopores with diameters varying from about 0.28 to about 0.35 nm. The nanopore network does not form clusters or micropores. The properties of the two network DLN may then be tailored by adding dopant. The dopants fill the nanopore network in a random fashion, eventually resulting, at a certain dopant concentration, in an additional network without clusters or microcrystalline grains, even at concentrations as high as 50 atomic %. At concentrations below about 10 atomic %, the dopants are distributed as separate atoms in the nanopores of the diamond-like matrix. The average distance between dopant atoms in this quasi-random structure can be controlled by the concentration of the dopant. When the relative concentration of the dopant element or compound reaches about 20–25 atomic %, the dopants form the third (Me-Me) network in the DLN structure as shown in FIG. 1(C).

The electrical properties of the DLN structures of the present invention can be continuously varied over a wide magnitude (at least about 20 orders) from a highly dielectric state to a highly conductive state while preserving and improving the properties of the DLN state. A transition to a superconducting state, with the absence of electrical resistivity, is observed at low temperatures for certain three-network nanocomposite networks.

Another advantage of the DLNs of the present invention is their relative hardness and durability. The DLNs, especially the metal doped DLNs combine high microhardness with high elasticity. The microhardness values of the DLNs of the present invention range from about 5 to about 30 GPa.

The DLNs may be synthesized via co-deposition by clusterless beams of ions, atoms or radicals of the relevant elements, where the mean free path of each particle species exceeds the distance between its source and the growing particle film surface, and each beam contains particles of well-defined energy. Carbon-containing particle beams can be produced by plasma discharge in a plasmatron and extracted as charged particles by a high-voltage field in a vacuum chamber and directed onto the substrate.

Figure 2:
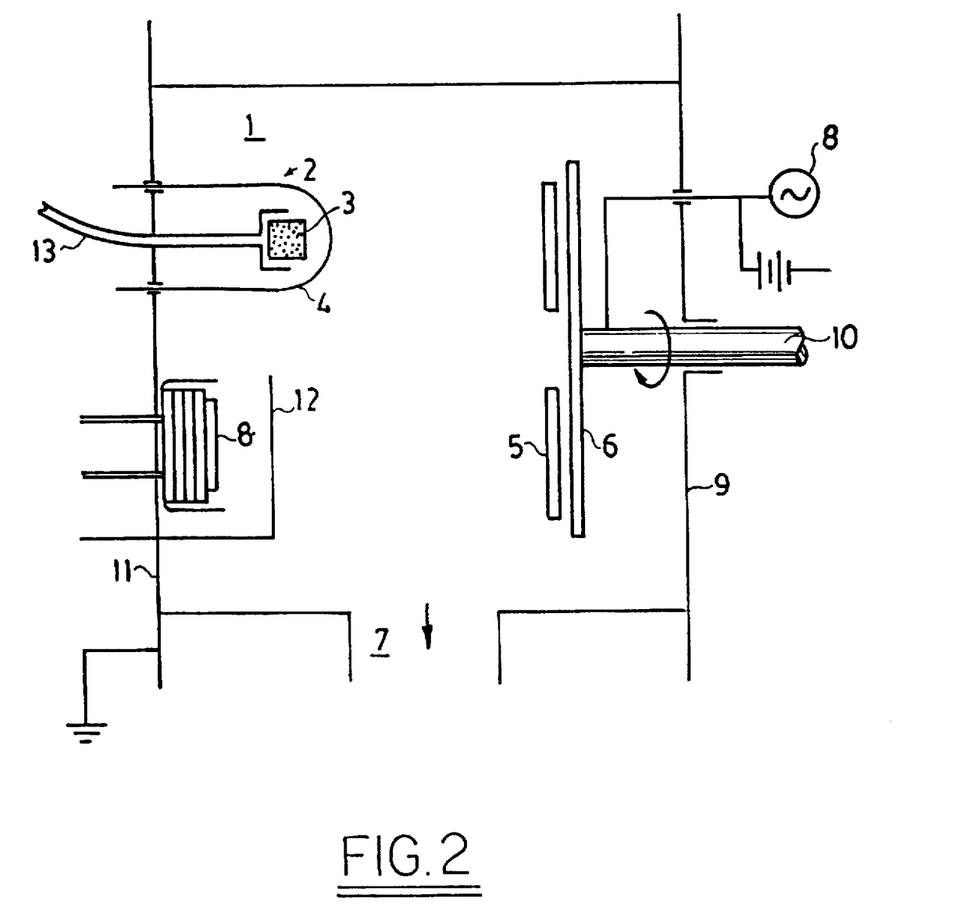
FIG. 2 is a schematic diagram detailing the main method of fabrication of the DLN coatings.

FIG. 2 shows one preferred embodiment of the coating chamber used for the DLN coating deposition process. A vacuum deposition chamber 1 is provided to coat a substrate sample. A precursor inlet system 13, comprises a metal tube and a porous ceramic material 3 through which a liquid precursor, preferably a polysiloxane, is injected. The precursor inlet system 13 is shown incorporated into the chamber through the chamber base plate 11. The thermocathode 2 comprises a resistively heated thoriated tungsten filament 4. Substrates, 5 to be coated with DLN film are attached to the substrate holder 6. The power supply 8 is used for biasing the substrates (DC or RF). In practice the system is "pumped down" using normal vacuum pump down procedures. A gate valve (not shown) located on port 7 is closed and the system is backfilled with dry air, nitrogen or argon until the chamber reaches atmospheric pressure. The door of the chamber, 9, is then opened and substrate to be coated 5 are attached to the substrate holder 6 using any of many possible methods (spring clip, screw, clamp, etc.). Special fixtures may be required for substrates of special shapes. The substrate holder is designed in a way that it will also hold a cylinder sample (not shown), which, in operation, rotates both about the axis of the central drive shaft 10, and its own axis which is perpendicular to 10. In this way, the axis of the cylinder would be perpendicular to the axis of 10.

When the substrates, for example razor blades either singly or in a stacked arrangement, are loaded, the door of the chamber is closed, the chamber evacuated, and the gate valve opened to bring system pressure down to at least $10^{-5}$ to $10^{-6}$ Torr, which is the desired range of system base pressure. When the above base pressure is achieved, argon gas is introduced into the chamber via a needle valve or mass flow controller, until the chamber pressure reaches approximately $5 \times 10^{-5}$ to $1 \times 10^{-3}$ Torr, preferably about $1-3 \times 10^{-4}$ Torr. The filament current, the filament bias and the electromagnet power supply are then switched on. The filament current is the current that passes through the thermocathode (also called the filament or the cathode). The filament bias is the constant floating voltage applied to the filament (approximately −150V in relation to ground). Plasma current is measured as the current between the filament and the base plate or ground. This voltage provides the field that moves electrons emitted by the filament to the base plate 11. The electromagnet power supply provides current to the electromagnet, which creates a magnetic field that results in the electron path becoming a spiral, increasing the electron path length and improving the probability of collisions between the electrons and the vapor molecules created due to precursor evaporation. The substrate bias power supply is concurrently switched on.

Switching on these power supplies results in creation of an argon plasma, which is used to clean the substrates prior to deposition. After the required duration of cleaning, the precursor supply is opened. Precursor flow is controlled via a needle valve and occurs due to the difference in pressure between the chamber and the outside atmosphere. When precursor flow and vaporization in the chamber has stabilized, the argon gas flow is turned off. The ionized precursor vapors form a plasma, ions from which are accelerated towards the substrate holder due to the substrate bias. Thus, deposition of DLN film onto the substrate occurs.

Co-deposition of a dopant material is carried out as follows. Argon flow to the magnetron is commenced and the magnetron 8 is switched on after the base pressure has been reached. A shutter 12 is used to prevent deposition while the substrate is cleaned via sputtering. When cleaning has been accomplished, the shutter is opened and sputtering is carried out at the desired power level. This may occur prior to commencement of DLN film deposition, during DLN film deposition, after DLN film deposition, or intermittently during DLN film deposition, depending on what kind of film structure and composition to be deposited are desired. Using DC or RF sputtering, materials of all kinds (metals, ceramics, alloys, etc.) can be used for co-deposition.

The growth conditions for nanocomposite films are as follows, with reference to FIG. 2. The pressure in the deposition chamber 1 should not exceed $10^{-3}$ torr, with the pressure in the active zone of the plasma generation 2, in the range from about $1.0 \times 10^{-3}$ to about $5.0 \times 10^{-2}$ torr. The temperature of the substrate should not exceed about 200° C. with the temperature of the cathode filaments being in the range from about 2100° to about 2950° C. The current in the cathode filament is from about 70 to about 130A, with the voltage across the filament being from about 20 to about 30 V. The voltage with respect to the ground is from about 70 to about 130 V with the plasma current being from about 0.5 to about 20.0A. The voltage of the substrate holder is from about 0.1 to about 5.0 Kv, with all the carbon-containing and Si-containing species having kinetic energy in the range of from about 100 to about 1200 eV and from about 25 to about 300 eV respectively. The metal beams consist of free atoms or monatomic ions. The kinetic energy of the metal atoms/ions does not exceed from about 25 eV. With a precursor flow rate from about 0.5 to about 5.0 cc/hour, the growth rate of the DLN is from about 0.1 to about 2.0 micrometers/hour.

The preferred range of operation for most applications is a pressure of about $1-3 \times 10^{-4}$ Torr, a plasma current of about 1 amp., a filament current of from about 60 to about 75 amp., a substrate voltage of from about 600 to about 1000 V DC, or forward power of about 100W in RF mode. The preferred frequency for RF mode is from about 90 to about 300 KHz. The preferred magnetron power depends on the type of material, composition and structure desired for the DLN coating.

Figure 3:
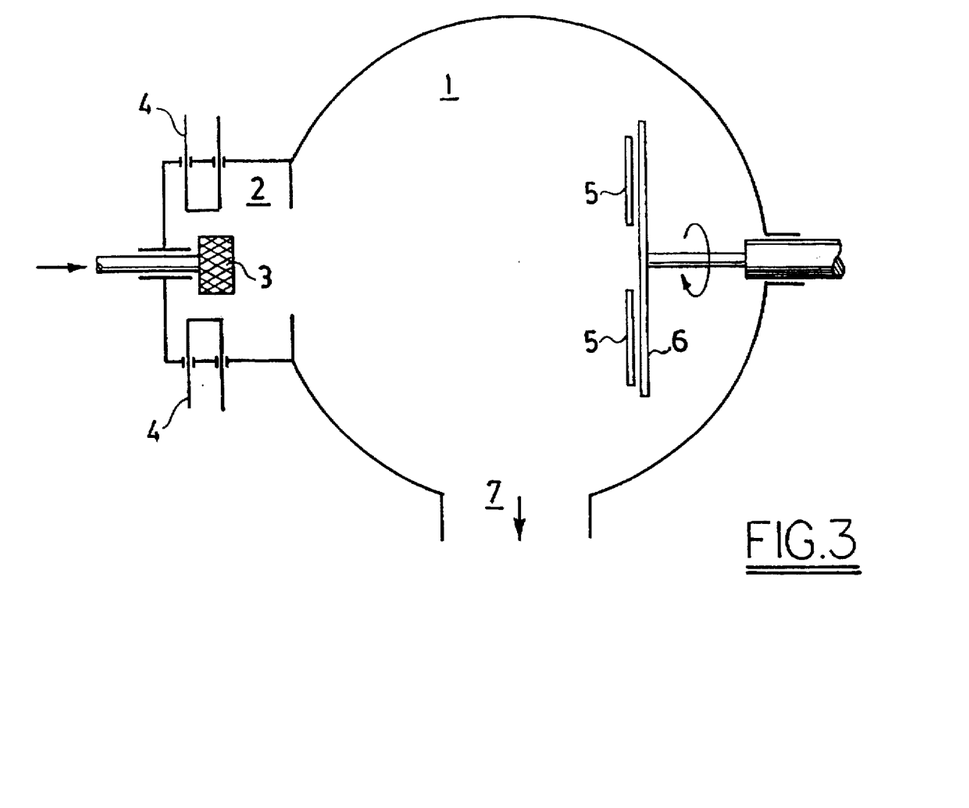
FIG. 3 is a schematic diagram detailing the methods of fabrication of DLN coatings using reflected beam flow.

In a further preferred embodiment, a plasma discharge in a triode plasmatron is used for DLN deposition, as shown schematically in FIG. 3, with the plasma energy density above about 5 Kwh/gram-atom of carbon. The charged particles are extracted by a high voltage field in the vacuum chamber and directed onto the substrate. It is preferable that the potential of the substrate holder is from about −0.3 to about +5.0 Kv, and most preferably 1.0+/−0.2 Kv for DC and RF. In the RF mode, the frequency is in the range of from about 0 to about 25 Mhz, and preferably from about 90 to about 300 kHz for RF. The ratio of the electron emission to the carbon precursor flow in the plasmatron is from about 0.5 to about 1.5 electrons per particle.

Organosilicon compounds, such as siloxane, are preferred precursors for C, H, Si and O. One preferred organosilicon compound is polyphenylmethylsiloxane, containing 1 to 10 Si atoms. The high boiling point siloxanes may be introduced directly into the active plasma region through a porous ceramic or metallo-ceramic (3 in FIGS. 3 and 4) which is heated via radiation thermocathodes 4. The photon and electron emission of the thermocathodes affect the evaporation, fragmentation and ionization of the precursor molecules on the surface of the ceramic, which thereby functions as an ion source for the plasma generator. An alternative method for injection of the siloxane precursors is to use direct injection from a diffusion pump.

The formation of dopant-containing beams may be realized by any one of, or combination of, the following methods: 1) thermal evaporation; 2) ion-sputtering; 3) ion beams. The dopant-containing beams are directed onto the growing film surface through the vacuum chamber to exclude interparticle collisions in the deposition chamber itself. Substrates are placed in an adjacent chamber on a rotating substrate holder, (for example a drum) which ensures double rotary motion, said adjacent chamber being connected to the plasma generation chamber by an opening for the emission of the atomic or ionic beams, as shown schematically in FIG. 3. Alternatively, the plasma generation may be carried out within the chamber containing the substrates (FIG. 2). A DC or a radio frequency potential is generally applied to the substrates during the deposition process. No external substrate heating is required. The substrate holder may be designed specifically to hold parts of different shapes such as cylinders, as would be apparent to one skilled in the field. Useful variation of the above described methods for deposition of DLN films include the use of sputtered silicon and oxygen gas as precursors for the Si and $O_2$, the use of sputtered carbon and hydrogen or hydrocarbon gas used as carbon and hydrogen precursors, or any combination thereof.

Figure 4:
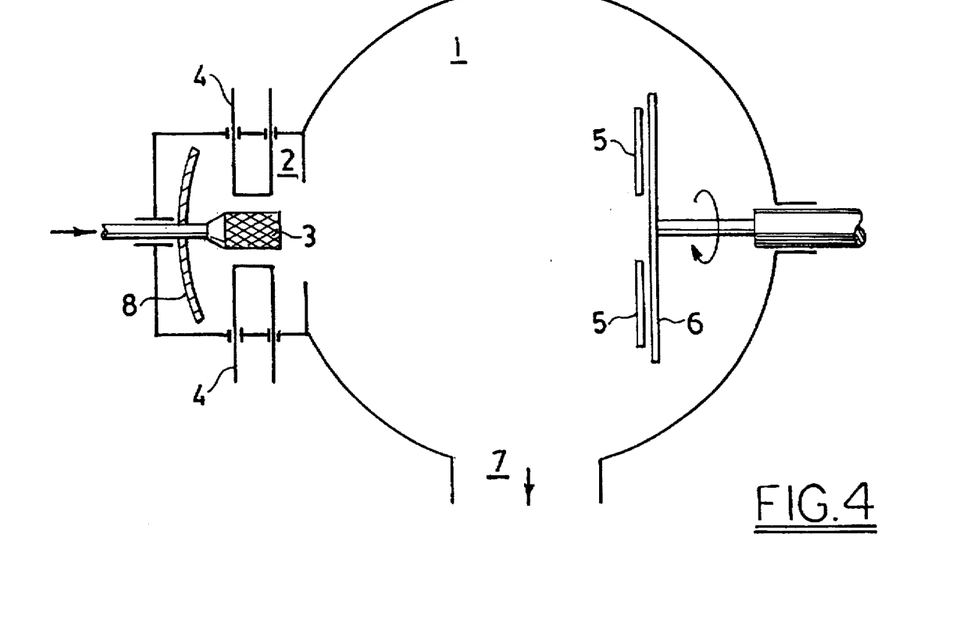
FIG. 4 is a schematic diagram detailing a preferred DLN fabrication and deposition chamber.

For deposition on non-conducting substrates, such as plastic, a method whereby a flow of neutral radicals is reflected from a high voltage target and directed to the substrate as shown schematically in FIG. 4. The process employs depositions similarly to those shown in FIG. 3, except that a reflecting electrode is used to generate a neutral beam. This process eliminates surface damage of the substrate resulting from charged and/or fast particles impinging on the substrate during growth.

Extremely uniform and nonporous thin dielectric films may be deposited according to the present invention. The thickness of the deposited DLN coating has no theoretical limit. Existing technology and available equipment have allowed atomic-scale composite films and coating thicknesses typically in the range from about tens of angstroms up to 10 micrometers. The thickness of DLN deposited to adequately protect a sharp edge will depend upon the nature of the substrate. Very small sharp blades may only require DLN coatings from about 5 nanometers to about 150 nanometers, while other apparatuses may require a protective DLN layer which is several micrometers (microns) thick. Therefore, the above-described DLN coatings of the present invention may be deposited on the selected substrate, or on interlayers if desired, in thicknesses ranging from about 5 nanometers to about 12 micrometers, preferably from about 20 nanometers to about 12 micrometers, depending only on the desired application of the coated substrate.

The deposition may be tailored or "tuned" to meet the properties required for a particular application. The random interpenetrating of the two- or three-network DLNs guarantees uniform strength of the structures in all directions. The structures are free of micropores even at thicknesses of about 80 Angstroms (8 nm). The DLNs are therefore extremely stable and possess unique combinations of chemical, mechanical, electronic, and superconducting properties.

Many uses for the precision edge-preserving DLN coatings of the present invention exist, including but not limited to the coating of metals and non-metals, surgical instruments, razor blades, industrial and non-industrial tools, cutlery, knives, pocket knives, and any precision-edged substrates which are vulnerable to corrosive and/or erosive attack, and dulling. The following examples serve only to further illustrate aspects of the present invention and should not be construed as limiting the invention.

EXAMPLE 1

Deposition of Undoped DLN Coatings on Razor Blades

One set of 2000 razor blades was coated on both sides with undoped DLN. The razor blades were mounted on a steel fixture with the blade edges facing the deposition sources (the blades held parallel to the beam). Deposition was carried out at a pressure of $1.1 \times 10^{-4}$ Torr, a plasma current of 1.0–1.1 amp. and an RF load power of 125W. The deposition took place for 30 minutes. Shutters were used to shield the substrates during startup and shutdown of the plasmatron. At the deposition rate of 0.7 micrometers/hr, the test run resulted in a deposited DLN thickness of 3000 angstroms (0.3 micrometers) on a blade surface held flat facing the deposition beam, and a 300 angstrom film on a surface held at a 10° angle to the deposition beam. The thickness on the ultimate blade tip was approximately 3000–5000 angstroms, which was too high, resulting a dulling of the blade.

EXAMPLE 2

A second coating run nearly identical to that described in Example 1 was conducted, except that the test time was 10 minutes. The shorter test time resulted in a deposited DLN coating thickness on the blade edges of approximately 300–500 angstroms. The radius of the blade tip after coating was 200–300 angstroms.

EXAMPLE 3

Deposition of Doped DLN Coatings

Additional blades were coated with Zr-DLN and W-DLN under the following chamber conditions. RF bias frequency was 100–250 kHz, the load power was 80–120W, forward power was 100–150W, with the tungsten (W) and zirconium (Zr) doping at from about 10–20%.

EXAMPLE 4

Wool Felt Cutting Test

Figure 8:
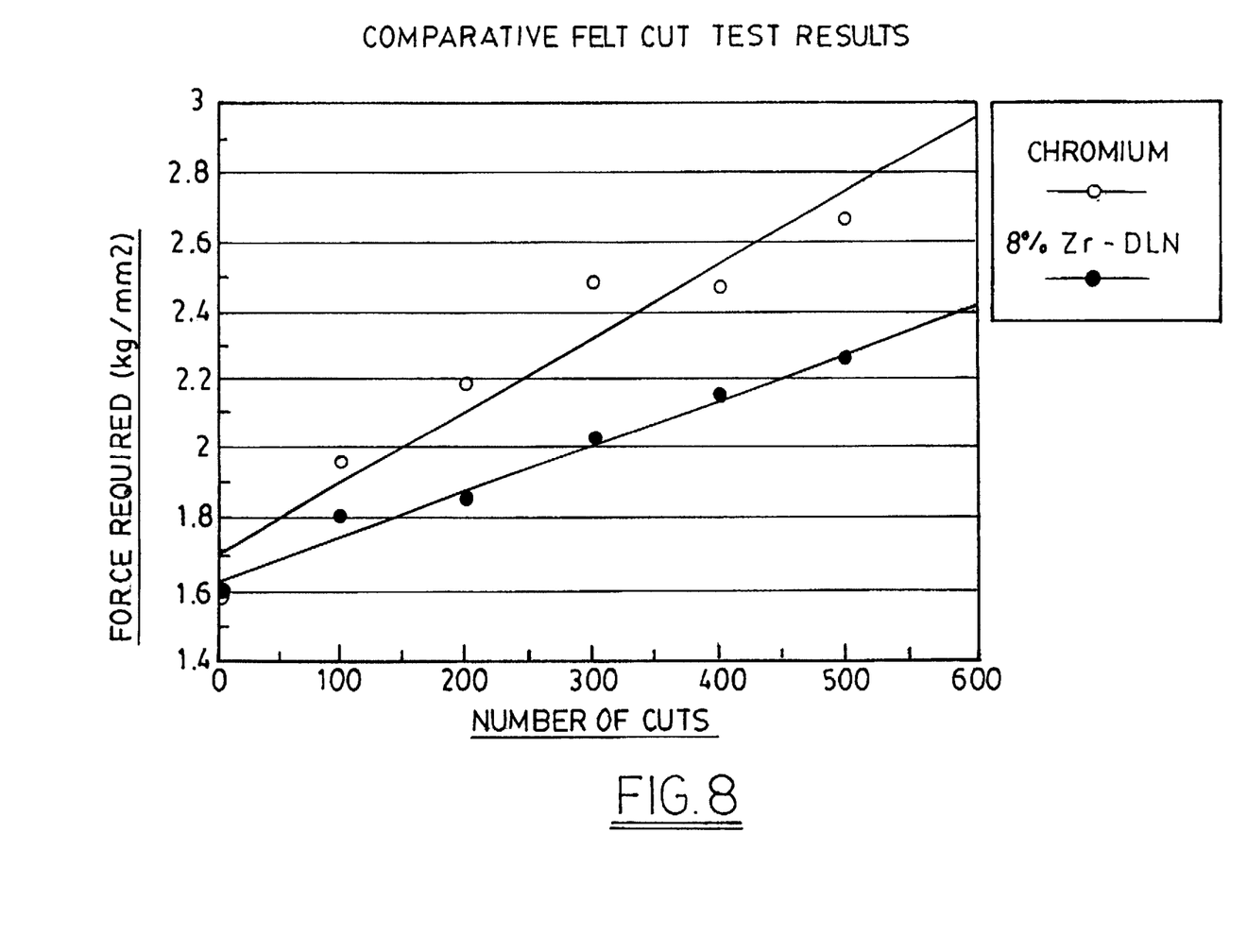
FIG. 8 is a graph of plotted values of the force required to make cuts in the wool felt cut test versus the number of cuts for chromium and DLN coated blades.

The blades coated according to the procedures of Examples 1–3 were tested by applying the blades against wool felt and cutting the felt 500 times. The difference between the force required to make the cut the first and last (500th) time was determined. A lower cutting force was required by the blades coated with the DLN versus chromium coated blades having a PTFE layer of 2000–3000 angstroms. See FIG. 8.

EXAMPLE 5

Mechanical Properties of DLN Films

High hardness and mechanical modulus measurements were obtained on 9 different compositions of DLN and doped-DLN films. Measurements were carried out using a nanoindenter (Nanoinstruments, Knoxville, Tenn.). Hardness ranged from about 6 to about 21 GPa. Elastic modulus of from about 60–220 GPa was achieved. Hardness/modulus degradation in the films was minimal after exposure to 500° C.

Many other modifications and variations of the present invention are possible to the skilled practitioner in the field in light of the teachings herein. It is therefore understood that, within the scope of the claims, the present invention can be practiced other than as herein specifically described.

What is claimed:

1. A method for preserving a precision edge of a precision-edged substrate comprising:
   providing a precision-edged substrate, wherein the precision-edged substrate is a cutting apparatus; and
   applying to said substrate a coating made from a diamond-like solid state material formed from interpenetrating networks comprising a diamond-like carbon network stabilized by hydrogen, a silicon network stabilized by oxygen, and optionally at least one network made from dopant elements or dopant compounds containing elements from Groups 1–7b and 8 of the periodic table.

2. The method according to claim 1, wherein the carbon, hydrogen, silicon and oxygen are obtained from the decomposition of an organosiloxane having from about 1 to about 10 silicon atoms.

3. The method according to claim 2, wherein the organosiloxane is polyphenylmethylsiloxane.

4. The method according to claim 1, wherein the carbon content of the coating is from about 40 wt. % to about 98 wt. %.

5. The method according to claim 1, wherein the carbon content of the coating is from about 50 wt.% to about 98 wt.%.

6. The method according to claim 1, wherein the carbon to silicon weight ratio of the coating is from about 2:1 to about 8:1.

7. The method according to claim 1, wherein the silicon to oxygen weight ratio of the coating is from about 0.5:1 to about 3:1.

8. The method according to claim 1, wherein the coating is deposited on a metal substrate.

9. The method according to claim 1, wherein the coating is deposited on a non-metal substrate.

10. The method according to claim 1, wherein the dopant elements are selected from the group consisting of B, Si, Ge, Te, O, Mo, W, Ta, Nb, Pd, Ir, Pt, V, Fe, Co, Mg, Mn, Ni, Ti, Zr, Cr, Re, Hf, Cu, Al, N, Ag, and Au.

11. The method according to claim 1, wherein the coating is deposited on the substrate to a thickness of from about 5 nm to about 12 micrometers.

12. The method according to claim 1, wherein the coating is deposited on the substrate to a thickness of from about 5 nm to about 150 nm.

13. The method according to claim 1, wherein the carbon content of the diamond-like solid state material is greater than about 40 atomic % of the DLN, the hydrogen content is up to about 40 atomic % of the carbon, and the sum of the silicon, oxygen and dopants together is greater than about 2 atomic % of the DLN.

14. A cutting apparatus comprising a precision-edged substrate coated with a precision-edge preserving coating, said coating comprising a diamond-like solid state material formed from interpenetrating networks comprising a first diamond-like carbon network stabilized by hydrogen, a second silicon network stabilized by oxygen and, optionally, at least one network of dopant elements, or dopant compounds containing elements from Groups 1–7b and 8 of the periodic table.

15. The apparatus according to claim 14, wherein the carbon, hydrogen, silicon and oxygen are obtained from the decomposition of an organosiloxane having from about 1 to about 10 silicon atoms.

16. The apparatus according to claim 15, wherein the organosiloxane is polyphenylmethylsiloxane.

17. The apparatus according to claim 14, wherein the carbon content of the coating is from about 40 wt. % to about 98 wt. %.

18. The apparatus according to claim 14, wherein the carbon content of the coating is from about 50 wt. % to about 98 wt. %.

19. The apparatus according to claim 14, wherein the carbon to silicon weight ratio of the coating is from about 2:1 to about 8:1.

20. The apparatus according to claim 14, wherein the silicon to oxygen weight ratio of the coating is from about 0.5:1 to about 3:1.

21. The apparatus according to claim 14, wherein the substrate comprises a metal.

22. The apparatus according to claim 14, wherein the substrate comprises a non-metal.

23. The apparatus according to claim 14, wherein the dopant elements are selected from the group consisting of B, Si, Ge, Te, O, Mo, W, Ta, Nb, Pd, Ir, Pt, V, Fe, Co, Mg, Mn, Ni, Ti, Zr, Cr, Re, Hf, Cu, Al, N, Ag, and Au.

24. The apparatus according to claim 14, wherein the carbon content of the solid state material is at least 40 atomic % of the coating, the hydrogen content is up to about 40 atomic % of the carbon, and the sum of the silicon, oxygen and dopants together is greater than about 2 atomic % of the coating.

25. The apparatus according to claim 14, wherein the coating is deposited on the substrate to a thickness of from about 5 nm to about 12 micrometers.

26. The apparatus according to claim 14, wherein the coating is deposited on the substrate to a thickness of from about 5 nm to about 150 nm.

27. The apparatus according to claim 14, wherein the apparatus is selected from the group consisting of industrial tools, surgical instruments, knives and razors.

28. The apparatus according to claim 14, wherein the apparatus is a razor blade.

* * * * *